(12) United States Patent
Chang et al.

(10) Patent No.: US 8,829,966 B2
(45) Date of Patent: Sep. 9, 2014

(54) CURRENT REUSE FREQUENCY DIVIDER AND METHOD THEREOF AND VOLTAGE CONTROL OSCILLATOR MODULE AND PHASE-LOCKED LOOP USING THE SAME

(71) Applicant: Industrial Technology Research Institute, Hsinchu (TW)

(72) Inventors: Chih-Hsiang Chang, Hsinchu (TW); Nai-Chen Cheng, Changhua County (TW); Yu Lee, Hsinchu County (TW); Ching-Yuan Yang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/727,612

(22) Filed: Dec. 27, 2012

(65) Prior Publication Data

US 2014/0139273 A1    May 22, 2014

(30) Foreign Application Priority Data

Nov. 22, 2012    (TW) ............................... 101143706 A

(51) Int. Cl.
G06F 1/04 (2006.01)
H03K 3/00 (2006.01)
H03B 19/14 (2006.01)

(52) U.S. Cl.
CPC ..................................... H03B 19/14 (2013.01)
USPC ........... 327/291; 327/199; 327/200; 327/201; 327/202

(58) Field of Classification Search
USPC ......... 327/115, 116, 117, 118, 355–361, 202, 327/203, 208–212, 218; 377/47, 48
See application file for complete search history.

(56) References Cited

U.S. PATENT DOCUMENTS

| | | | |
|---|---|---|---|
| 7,671,635 B2* | 3/2010 | Fan et al. | 327/105 |
| 7,961,056 B2 | 6/2011 | Taylor et al. | |
| 2008/0303561 A1* | 12/2008 | Chu et al. | 327/115 |
| 2010/0052738 A1* | 3/2010 | Won et al. | 327/117 |
| 2010/0194485 A1 | 8/2010 | Chawla et al. | |
| 2011/0018596 A1* | 1/2011 | Lee et al. | 327/156 |
| 2011/0156829 A1 | 6/2011 | Wang | |
| 2011/0210767 A1* | 9/2011 | Chang et al. | 327/118 |
| 2013/0271188 A1* | 10/2013 | Chan | 327/118 |

OTHER PUBLICATIONS

Ng et al., "A 1V 24GHz 17.5mW PLL in 0.18um CMOS," IEEE International Solid-State Circuits Conference, Feb. 8, 2005, pp. 158-159 and 590.

(Continued)

*Primary Examiner* — Brandon S Cole
(74) *Attorney, Agent, or Firm* — Jianq Chyun IP Office

(57) ABSTRACT

A current reuse frequency divider including a first latch circuit and a second latch circuit is provided. The first latch circuit includes a first transistor pair and a second transistor pair. The first latch circuit receives a first differential oscillation signal through bodies of the first transistor pair and the second transistor pair and divides the frequency of the first differential oscillation signal to generate a second differential oscillation signal. The second latch circuit is coupled to the first latch circuit and includes a third transistor pair and a fourth transistor pair. The second latch circuit receives the first differential oscillation signal through bodies of the third transistor pair and the fourth transistor pair and divides the frequency of the first differential oscillation signal to generate a third differential oscillation signal.

19 Claims, 5 Drawing Sheets

(56) References Cited

OTHER PUBLICATIONS

Park et al., "A Low-Noise and Low-Power Frequency Synthesizer Using Offset Phase-Locked Loop in 0.13-um CMOS," IEEE Microwave and Wireless Components Letters 20 (1), Jan. 2010, pp. 52-54.

Parker et al., "A 15mW 3.125GHz PLL for Serial Backplane Transceivers in 0.13m CMOS," IEEE International Solid-State Circuits Conference, Feb. 9, 2005, pp. 412-413 and 607.

Gao et al., "A 2.2GHz 7.6mW Sub-Sampling PLL with-126dBc/Hz In-Band Phase Noise and 0.15psrms Jitter in 0.18um CMOS," IEEE International Solid-State Circuits Conference, Feb. 11, 2009, pp. 392-393.

Lu et al., "A Low-Power Quadrature VCO and Its Application to a 0.6-V 2.4-GHz PLL," IEEE Transactions on Circuits and Systems I: Regular Papers 57 (4), Apr. 2010, pp. 793-802.

Pellerano et al., "A 13.5-mW 5-GHz Frequency Synthesizer With Dynamic-Logic Frequency Divider," IEEE Journal of Solid-State Circuits 39 (2), Feb. 2004, pp. 378-383.

Hung et al., "A Fully Integrated 1.5-V 5.5-GHz CMOS Phase-Locked Loop," IEEE Journal of Solid-State Circuits 37 (4), Apr. 2002, pp. 521-525.

Leung et al., "A 1-V 9.7-mW CMOS Frequency Synthesizer for IEEE 802.11a Transceivers," IEEE Transactions on Microwave Theory and Techniques 56 (1), Jan. 2008, pp. 39-48.

\* cited by examiner

CURRENT REUSE FREQUENCY DIVIDER AND METHOD THEREOF AND VOLTAGE CONTROL OSCILLATOR MODULE AND PHASE-LOCKED LOOP USING THE SAME

CROSS-REFERENCE TO RELATED APPLICATION

This application claims the priority benefit of Taiwan application serial no. 101143706, filed on Nov. 22, 2012. The entirety of the above-mentioned patent application is hereby incorporated by reference herein and made a part of this specification.

BACKGROUND

1. Technical Field

The technical field relates to a frequency divider and a frequency division method thereof and electronic devices using the same.

2. Related Art

Along with the development of wireless communication technologies in recent years, the manufacturing technologies of integrated circuits (IC, especially ICs applied to radio frequency (RF) receivers and transmitters) have changed drastically within a short period. Presently, ICs have been broadly applied in the frequency range of giga hertz (GHz) and are being developed towards higher operation frequencies. As a result, the circuit design at the transmitters and receivers becomes very complicated and high power-consuming and, on the other hand, very challenging. Thereby, how to design a high-frequency RF circuit which offers low power consumption and a stable and low-power regulatable reference frequency for a RF system could be one of today's major subjects.

Frequency dividers play a very important role in genera RF circuits and phase-locked loops (PLL) and are the fundamental/critical circuits in wireless communication systems. The maximum operation frequency of a PLL is usually restricted by the operation frequency range of the first-stage frequency divider. Existing frequency dividers can be categorized into current reuse frequency dividers, injection-locked frequency dividers (ILFD), and regenerative frequency dividers.

A current reuse frequency divider usually offers a high sensitivity and a large bandwidth. However, because a current reuse frequency divider in which transistors are driven with gate input signals has to be implemented with a circuit of cascoded transistors, the normal operation bias of the current reuse frequency divider (i.e., the voltage headroom of the current reuse frequency divider) cannot be reduced due to the number of cascoded transistors. Thereby, in general frequency divider circuit design, a current reuse frequency divider should not be implemented by cascoding multiple current reuse structures.

SUMMARY

The disclosure provides a current reuse frequency divider including a first latch circuit and a second latch circuit. The first latch circuit includes a first transistor pair and a second transistor pair. The first latch circuit receives a first differential oscillation signal through bodies of the first transistor pair and the second transistor pair and divides the frequency of the first differential oscillation signal to generate a second differential oscillation signal. The second latch circuit is coupled to the first latch circuit. The second latch circuit includes a third transistor pair and a fourth transistor pair. The second latch circuit receives the first differential oscillation signal through bodies of the third transistor pair and the fourth transistor pair and divides the frequency of the first differential oscillation signal to generate a third differential oscillation signal.

The disclosure provides a voltage control oscillator (VCO) module including a VCO, an injection locked frequency divider (ILFD), and a first current reuse frequency divider. The VCO generates a first differential oscillation signal and regulates the frequency of the first differential oscillation signal under the control of a control voltage. The ILFD is coupled to the VCO. The ILFD receives the first differential oscillation signal and divides the frequency of the first differential oscillation signal to generate a second differential oscillation signal and a third differential oscillation signal. The first current reuse frequency divider is coupled to the ILFD and includes a first latch circuit and a second latch circuit. The first latch circuit includes a first transistor pair and a second transistor pair. The first latch circuit receives the second differential oscillation signal or the third differential oscillation signal through bodies of the first transistor pair and the second transistor pair and divides the frequency of the second differential oscillation signal or the third differential oscillation signal to generate a fourth differential oscillation signal. The second latch circuit is coupled to the first latch circuit. The second latch circuit includes a third transistor pair and a fourth transistor pair. The second latch circuit receives the second differential oscillation signal or the third differential oscillation signal through bodies of the third transistor pair and the fourth transistor pair and divides the frequency of the second differential oscillation signal or the third differential oscillation signal to generate a fifth differential oscillation signal.

The disclosure provides a phase-locked loop (PLL) including a phase detector, a charge pump, a loop filter, a VCO module, and a frequency divider circuit. The phase detector compares the phase of a reference signal with the phase of a differential output signal and outputs a control signal. The charge pump is coupled to the phase detector. The charge pump generates a control voltage in response to the control signal. The loop filter is coupled to the charge pump. The loop filter filters high-frequency noises out of the control voltage. The VCO module is coupled to the loop filter and includes a VCO, an ILFD, and a first current reuse frequency divider. The VCO generates a first differential oscillation signal and regulates the frequency of the first differential oscillation signal under the control of the control voltage. The ILFD is coupled to the VCO. The ILFD receives the first differential oscillation signal and divides the frequency of the first differential oscillation signal to generate a second differential oscillation signal and a third differential oscillation signal. The first current reuse frequency divider is coupled to the ILFD and includes a first latch circuit and a second latch circuit. The first latch circuit includes a first transistor pair and a second transistor pair. The first latch circuit receives the second differential oscillation signal or the third differential oscillation signal through bodies of the first transistor pair and the second transistor pair and divides the frequency of the second differential oscillation signal or the third differential oscillation signal to generate a fourth differential oscillation signal. The second latch circuit is coupled to the first latch circuit and includes a third transistor pair and a fourth transistor pair. The second latch circuit receives the second differential oscillation signal or the third differential oscillation signal through bodies of the third transistor pair and the fourth transistor pair and divides the frequency of the second differential oscillation signal or the third differential oscillation signal to generate a fifth differential oscillation signal. The frequency divider circuit is coupled to the VCO module and the phase detector. The frequency divider circuit divides the frequency of the fourth differential oscillation signal or the fifth differential oscillation signal to generate the differential output signal.

The disclosure provides a frequency division method adapted to a current reuse frequency divider including a plurality of transistor pairs. The frequency division method includes following steps. A first differential oscillation signal is received through bodies of the transistor pairs. The frequency of the first differential oscillation signal is divided to generate a second differential oscillation signal and a third differential oscillation signal.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
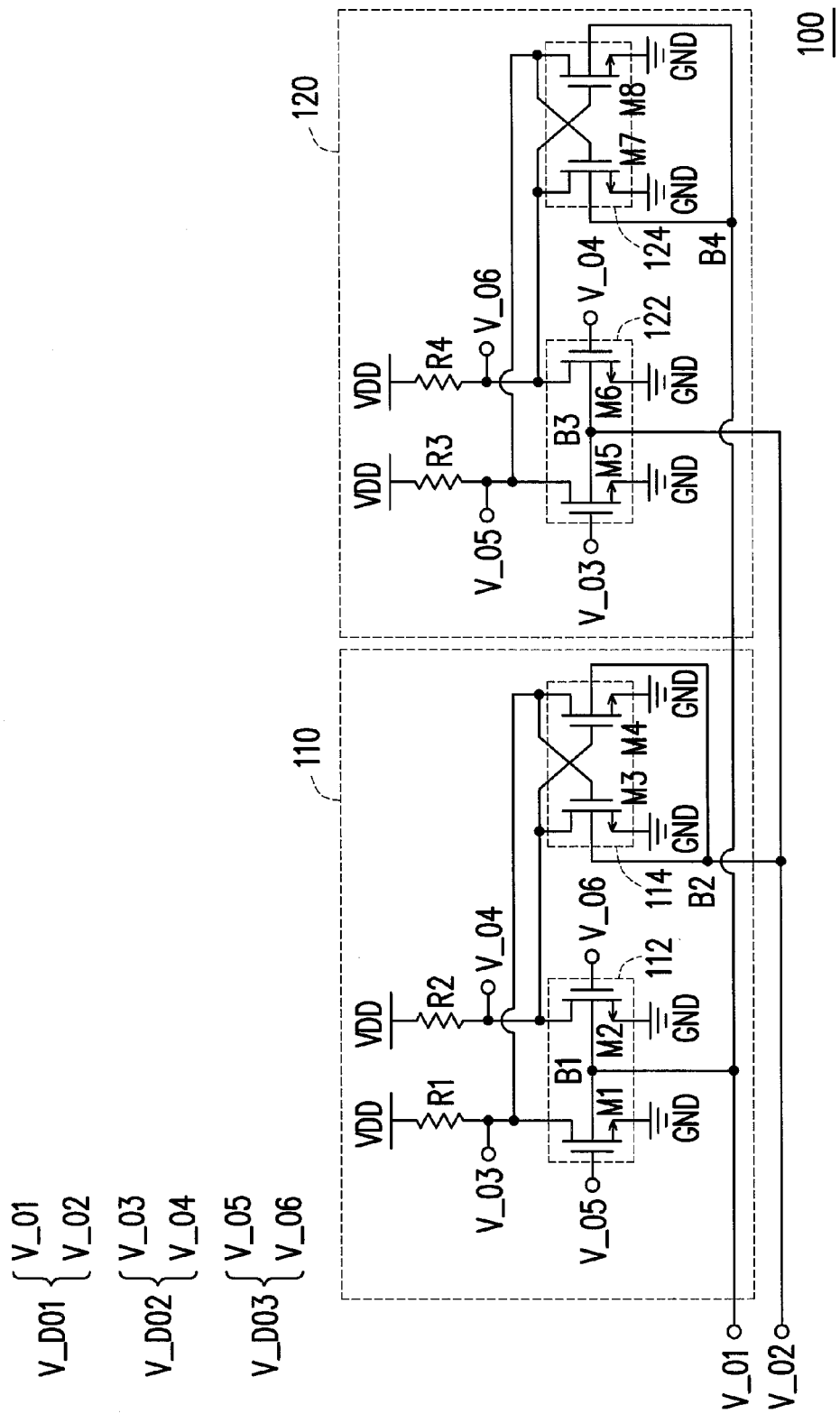
FIG. 1 is a circuit diagram of a current reuse frequency divider according to an embodiment of the disclosure.

Exemplary embodiments of the disclosure provide a current reuse frequency divider, a frequency division method thereof, and a voltage control oscillator (VCO) module and a phase-locked loop (PLL) using the same. In the current reuse frequency divider, bodies of transistor pairs are used for inputting signals so that the voltage headroom of the circuit can be effectively reduced and the circuit can be cascoded with other circuits. Reference will now be made in detail to embodiments of the disclosure, examples of which are illustrated in the accompanying drawings, wherein like reference numerals refer to the like elements throughout.

FIG. 1 is a circuit diagram of a current reuse frequency divider according to an embodiment of the disclosure. Referring to FIG. 1, the current reuse frequency divider 100 includes a first latch circuit 110 and a second latch circuit 120. The first latch circuit 110 includes transistor pairs 112 and 114. The second latch circuit 120 is coupled to the first latch circuit 110 and includes transistor pairs 122 and 124. The first latch circuit 110 receives a differential oscillation signal V_D01 through bodies of the transistor pairs 112 and 114 and divides the frequency of the differential oscillation signal V_D01 to generate a differential oscillation signal V_D02. Similarly, the second latch circuit 120 receives the differential oscillation signal V_D01 through bodies of the transistor pairs 122 and 124 and divides the frequency of the differential oscillation signal V_D01 to generate a differential oscillation signal V_D03.

In the present exemplary embodiment, the first latch circuit 110 includes transistors M1-M4, and the second latch circuit 120 includes transistors M5-M8. The transistors M1-M8 are n-type metal-oxide-semiconductor field-effect transistors (N-MOSFET). However, the type of the transistors M1-M8 is not limited in the disclosure. The transistors M1 and M2 form the transistor pair 112, the transistors M3 and M4 form the transistor pair 114, the transistors M5 and M6 form the transistor pair 122, and the transistors M7 and M8 form the transistor pair 124. Besides, the differential oscillation signals V_D01-V_D03 are respectively composed of oscillation signals V_01 and V_02, oscillation signals V_03 and V_04, and oscillation signals V_05 and V_06 of reverse phases.

In the first latch circuit 110, the gate of the transistor M1 receives the oscillation signal V_05 generated by the second latch circuit 120, the drain of the transistor M1 outputs the oscillation signal V_03, and the source of the transistor M1 is coupled to a ground voltage GND. The gate of the transistor M2 receives the oscillation signal V_06 generated by the second latch circuit 120, the drain of the transistor M2 outputs the oscillation signal V_04, and the source of the transistor M2 is coupled to the ground voltage GND. The body of the transistor M2 and the body of the transistor M1 are both coupled to a node B1 for receiving the oscillation signal V_01. The gate of the transistor M3 is coupled to the drain of the transistor M1, the drain of the transistor M3 is coupled to the drain of the transistor M2, and the source of the transistor M3 is coupled to the ground voltage GND. The gate of the transistor M4 is coupled to the drain of the transistor M2, the drain of the transistor M4 is coupled to the drain of the transistor M1, the source of the transistor M4 is coupled to the source of the transistor M1, and the body of the transistor M4 and the body of the transistor M3 are both coupled to a node B2 for receiving the oscillation signal V_02.

In the second latch circuit 120, the gate of the transistor M5 is coupled to the drain of the transistor M1 for receiving the oscillation signal V_03, the drain of the transistor M5 is coupled to the gate of the transistor M1 and outputs the oscillation signal V_05, and the source of the transistor M5 is coupled to the ground voltage GND. The gate of the transistor M6 is coupled to the drain of the transistor M2 and receives the oscillation signal V_04, the drain of the transistor M6 is coupled to the gate of the transistor M2 and outputs the oscillation signal V_06, the source of the transistor M6 is coupled to the ground voltage GND, and the body of the transistor M6 and the body of the transistor M5 are both coupled to a node B3 for receiving the oscillation signal V_02. The gate of the transistor M7 is coupled to the drain of the transistor M5, the drain of the transistor M7 is coupled to the drain of the transistor M6, and the source of the transistor M7 is coupled to the ground voltage GND. The gate of the transistor M8 is coupled to the drain of the transistor M6, the drain of the transistor M8 is coupled to the drain of the transistor M5, the source of the transistor M8 is coupled to the ground voltage GND, and the body of the transistor M8 and the body of the transistor M7 are both coupled to a node B4 for receiving the oscillation signal V_01.

In addition, a supply voltage VDD is respectively supplied to the transistors M1-M8 via corresponding resistors R1-R4, so that the transistors M1-M8 can perform frequency division operations in response to the differential oscillation signal V_D01.

Figure 2:
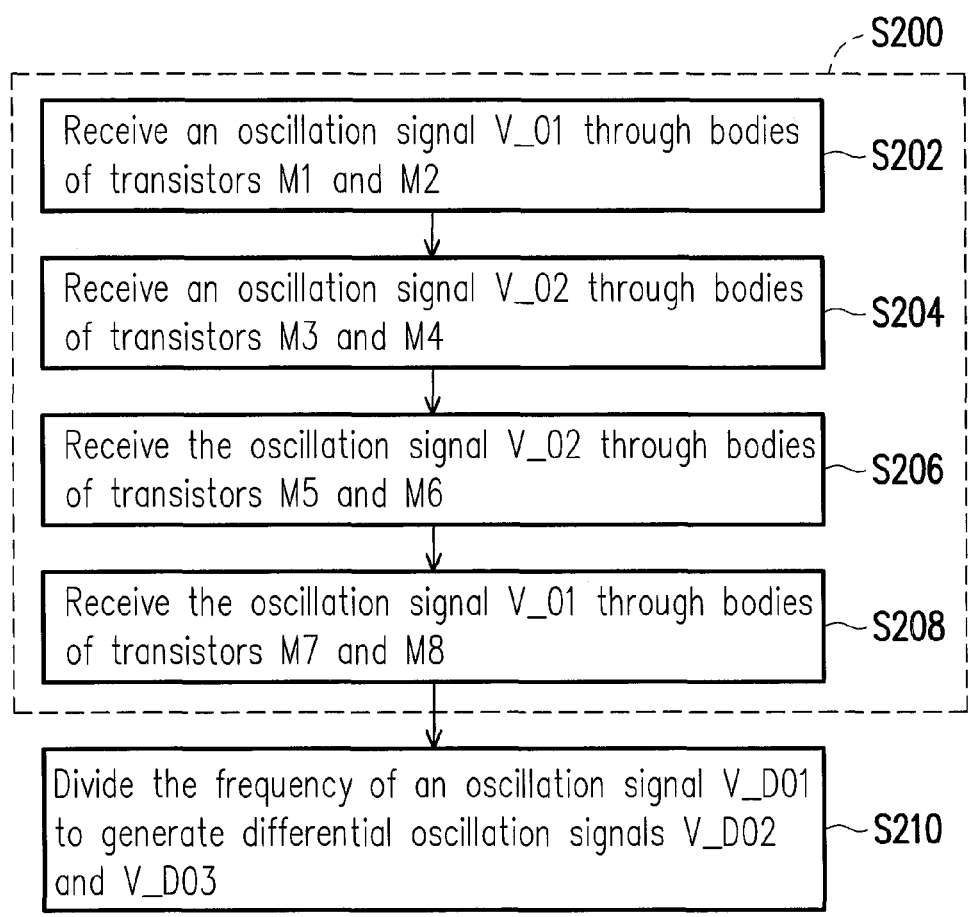
FIG. 2 is a flowchart of a frequency division method according to an embodiment of the disclosure.

FIG. 2 is a flowchart of a frequency division method according to an embodiment of the disclosure. Referring to both FIG. 1 and FIG. 2, under the circuit configuration of FIG. 1, when the current reuse frequency divider 100 performs a frequency division operation, the first latch circuit 110 and the second latch circuit 120 receive the differential oscillation signal V_D01 through bodies of the transistor pairs 112, 114, 122, and 124 (step S200) and divides the frequency of the differential oscillation signal V_D01 to generate the differential oscillation signals V_D02 and V_D03 (step S210).

To be specific, the transistor pair 112 receives the oscillation signal V_01 through the node B1 and bodies of the transistors M1 and M2 (step S202), the transistor pair 114 receives the oscillation signal V_02 through the node B2 and bodies of the transistors M3 and M4 (step S204), the transistor pair 122 receives the oscillation signal V_02 through the node B3 and bodies of the transistors M5 and M6 (step S206), and the transistor pair 124 receives the oscillation signal V_01 through the node B4 and bodies of the transistors M7 and M8 (step S208). Thus, the first latch circuit 110 and the second latch circuit 120 divide the frequencies of the received oscillation signals V_01 and V_02 to generate the oscillation signals V_03-V_06.

To be specific, because the threshold voltage, and accordingly the drain current, of a MOSFET usually changes with the voltage level on the body thereof, a body transconductance $g_{mb}$ related to the body-source voltage and the drain current of the MOSFET can be obtained. Accordingly, a transistor operation characteristic similar to that achieved by operating the transistor through gate driven (i.e., the gate is used as the signal input terminal) can be achieved by operating the transistor through bulk driven (i.e., the body is used as the signal input terminal).

Compared to that in a general gate driven frequency divider, in the current reuse frequency divider 100, because the differential oscillation signal V_D01 is received through bodies of the transistors M1-M8, the frequency division operation is not accomplished through cascoded transistors. Thus, the drain-source voltages of the transistors M1-M8 are effectively reduced. In other words, the current reuse frequency divider 100 can operate with a lower supply voltage VDD, and accordingly the power consumption of the entire circuit is reduced.

Based on the characteristic described above, the current reuse frequency divider 100 can be effectively applied in a cascoding circuit structure (for example, a current reuse circuit structure) without affecting the operation stability of the circuit due to overlarge supply voltage VDD (this part will be further explained in subsequent exemplary embodiments).

On the other hand, in the present exemplary embodiment, because the resonance point (i.e., the node for outputting the oscillation signal) between the first latch circuit 110 and the second latch circuit 120 is cross-coupled to the gate of the corresponding transistor, a dependency exists between the first latch circuit 110 and the second latch circuit 120, so that the differential oscillation signals V_D02 and V_D03 are orthogonal to each other. In other words, the signals generated by the current reuse frequency divider 100 through frequency division are quadrature phase signals. Namely, the phases of the oscillation signals V_03-V_06 may respectively be 0°, 180°, 90°, and 270°. In addition, with the structure/configuration of the current reuse frequency divider 100 described above, the frequency division operation performed by the current reuse frequency divider 100 is a frequency halving operation. In other words, the frequency of the differential oscillation signal V_D02 or V_D03 is half of the frequency of the differential oscillation signal V_D01. However, the disclosure is not limited thereto, and in other embodiments, the current reuse frequency divider 100 may have different structures and accordingly perform the frequency division operation by different divisors.

The current reuse frequency divider 100 in the disclosure is assumed to have a frequency division structure outputting quadrature phase signals. However, the disclosure is not limited thereto. According to the exemplary embodiment described above, those having ordinary knowledge in the art should be able to implement a frequency division structure/configuration in which the bodies of transistor pairs are served as signal input terminals by using a single first latch circuit 110 or second latch circuit 120.

Figure 3:
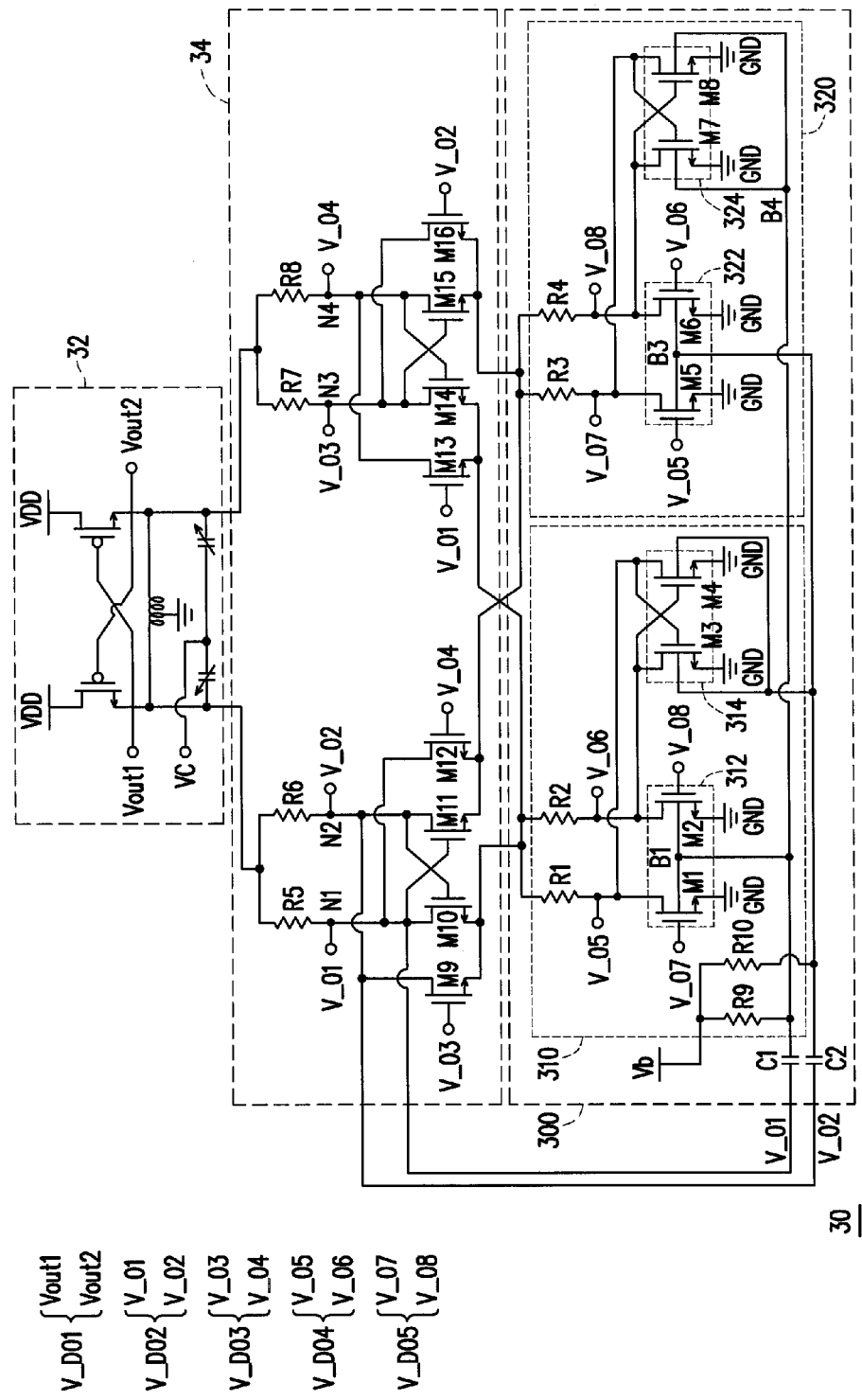
FIG. 3 is a circuit diagram of a voltage control oscillator (VCO) module according to an embodiment of the disclosure.

FIG. 3 is a circuit diagram of a VCO module according to an embodiment of the disclosure. Referring to FIG. 3, the VCO module 30 includes a current reuse frequency divider 300, a VCO 32, and an injection locked frequency divider (ILFD) 34. The VCO 32 generates a differential oscillation signal V_D01 and regulates the frequency of the differential oscillation signal V_D01 under the control of a control voltage VC. In the present exemplary embodiment, the VCO 32 can be implemented with varactor(s), inductor(s), or p-type transistor(s). However, the disclosure is not limited thereto.

The ILFD 34 is coupled to the VCO 32. The ILFD 34 receives the differential oscillation signal V_D01 and divides the frequency of the differential oscillation signal V_D01 to generate the differential oscillation signal V_D02 and the differential oscillation signal V_D03. The current reuse frequency divider 300 is coupled to the ILFD 34. The current reuse frequency divider 300 includes a first latch circuit 310 and a second latch circuit 320. The first latch circuit 310 includes a transistor pair 312 composed of transistors M1 and M2 and a transistor pair 314 composed of transistors M3 and M4. The second latch circuit 320 includes a transistor pair 322 composed of transistors M5 and M6 and a transistor pair 324 composed of transistors M7 and M8. The first latch circuit 310 receives a differential oscillation signal V_D02 or V_D03 through bodies of the transistor pairs 312 and 314 and divides the frequency of the differential oscillation signal V_D02 or V_D03 to generate a differential oscillation signal V_D04. Similarly, the second latch circuit 320 receives a differential oscillation signal V_D02 or V_D03 through bodies of the transistor pairs 322 and 324 and divides the frequency of the differential oscillation signal V_D02 or V_D03 to generate a differential oscillation signal V_D05. Additionally, other aspects of the circuit structure/configuration and operation of the current reuse frequency divider 300 can be referred to the embodiments illustrated in FIG. 1 and FIG. 2 therefore will not be described herein.

To be specific, the ILFD 34 includes transistors M9-M16. The gate of the transistor M9 receives the oscillation signal V_03, and the source of the transistor M9 outputs the oscillation signal V_02. The drain of the transistor M10 outputs the oscillation signal V_01, and the sources of the transistors M9 and M10 are both coupled to the drains of the transistors M1-M4 in the first latch circuit 310. The gate of the transistor M11 is coupled to the drain of the transistor M10, and the drain of the transistor M11 is coupled to the drain of the transistor M9 and the gate of the transistor M10. The gate of the transistor M12 receives the oscillation signal V_04, the drain of the transistor M12 is coupled to the drain of the transistor M10, and the sources of the transistors M11 and M12 are both coupled to the drains of the transistors M5-M8 in the second latch circuit 320. The gate of the transistor M13 is coupled to the drain of the transistor M10 for receiving the oscillation signal V_01, and the drain of the transistor M13 is coupled to the gate of the transistor M12 and outputs the oscillation signal V_04. The drain of the transistor M14 is coupled to the gate of the transistor M9 and outputs the oscillation signal V_03, and the sources of the transistors M13 and M14 are both coupled to the drains of the transistors M1-M4 in the first latch circuit 310. The gate of the transistor M15 is coupled to the drain of the transistor M14, and the drain of the transistor M15 is coupled to the drain of the transistor M13 and the gate of the transistor M14. The gate of the transistor M16 is coupled to the drain of the transistor M9 for receiving the oscillation signal V_02, the drain of the transistor M16 is coupled to the drain of the transistor M14 and the gate of the transistor M15, and the sources of the transistors M15 and M16 are both coupled to the drains of the transistors M5-M8 in the second latch circuit 320.

In the present embodiment, the VCO 32 injects an oscillation signal Vout1 to the drains of the transistors M9-M12 respectively through resistors R5 and R6 and injects an oscillation signal Vout2 to the drains of the transistors M13-M16 respectively through resistors R7 and R8 to allow the ILFD 34 to generate the oscillation signals V_01-V_04. Herein the ILFD 34 performs the frequency halving operation and generates the quadrature phase oscillation signals V_01-V_04 through the cross-coupled structure/configuration of the transistors M9-M16. Namely, the frequencies of the oscillation signals V_01-V_04 are respectively half of the frequencies of the oscillation signals Vout1 and Vout2.

After the ILFD 34 generates the oscillation signals V_01-V_04, the current reuse frequency divider 300 receives the differential oscillation signal V_D02 or V_D03 from the ILFD 34 through bodies of the transistors M1-M8. Herein it is assumed that the differential oscillation signal V_D01 is the input signal of the current reuse frequency divider 300. The bodies of the transistors M1, M2, M7, and M8 of the current reuse frequency divider 300 are coupled to the node N1 through a filter capacitor C1 for receiving the oscillation signal V_01, the bodies of the transistors M3, M4, M5, and M6 are coupled to the node N2 through a filter capacitor C2 for receiving the oscillation signal V_02, and the body of each one of the transistors M1-M8 works with a bias voltage Vb. Thus, the current reuse frequency divider 300 divides the frequencies of the received oscillation signals V_01 and V_02 to generate the quadrature phase oscillation signals V_05-V_08. Herein the frequencies of the oscillation signals V_05-V_08 are respectively a half of the frequencies of the oscillation signals V_01-V_04 and are respectively a quarter of the frequencies of the oscillation signals Vout1 and Vout2.

To be specific, the VCO module 30 in the present exemplary embodiment has a current reuse circuit structure. Namely, the VCO 32, the ILFD 34, and the current reuse frequency divider 330 are cascoded with each other to share a same current path. With the current reuse circuit structure/configuration, the VCO 32, the ILFD 34, and the current reuse frequency divider 300 can work properly, and the operation currents thereof are reduced at least by half. Thus, the VCO module 30 in the present embodiment offers a relatively low power consumption.

Additionally, because the voltage headroom of the current reuse frequency divider 300 is reduced, the VCO module 30 can work with a relatively low supply voltage VDD. For example, with the circuit structure/configuration described above, the cross voltage on each stage of circuits is only about 0.6V. Thus, a supply voltage VDD of merely 1.8V can be supplied to the VCO module 30 to allow the VCO 32, the ILFD 34, and the current reuse frequency divider 300 to work properly. To be specific, because the voltage headroom is reduced, the number of cascoded current reuse frequency dividers in the VCO module 30 can be increased within a reasonable range of the supply voltage VDD to obtain oscillation signals of different frequencies (the frequency is halved with every added current reuse frequency divider).

On the other hand, in a general current reuse circuit structure/configuration, the sources of the transistors M9-M12 are all coupled to the first latch circuit 310, and the sources of the transistors M13-M16 are all coupled to the second latch circuit 320. However, with such a circuit structure, the half-frequency oscillation signals V_01-V_04 output by the ILFD 310 and the quarter-frequency oscillation signals V_05-V_08 output by the current reuse frequency divider 320 interfere each other on the nodes N3 and N4 between the ILFD 310 and the current reuse frequency divider 320, and accordingly the phase noise characteristic of the current reuse frequency divider 300 is affected.

Thereby, by coupling the sources of the transistors M9, M10, M13, and M14 to the first latch circuit 310 and coupling the sources of the transistors M11, M12, M15, and M16 to the second latch circuit 320, the VCO module 30 in the present exemplary embodiment can effectively block the signal interference from a previous stage of circuit on the nodes N3 and N4 and accordingly can maintain a good phase noise characteristic.

Figure 4:
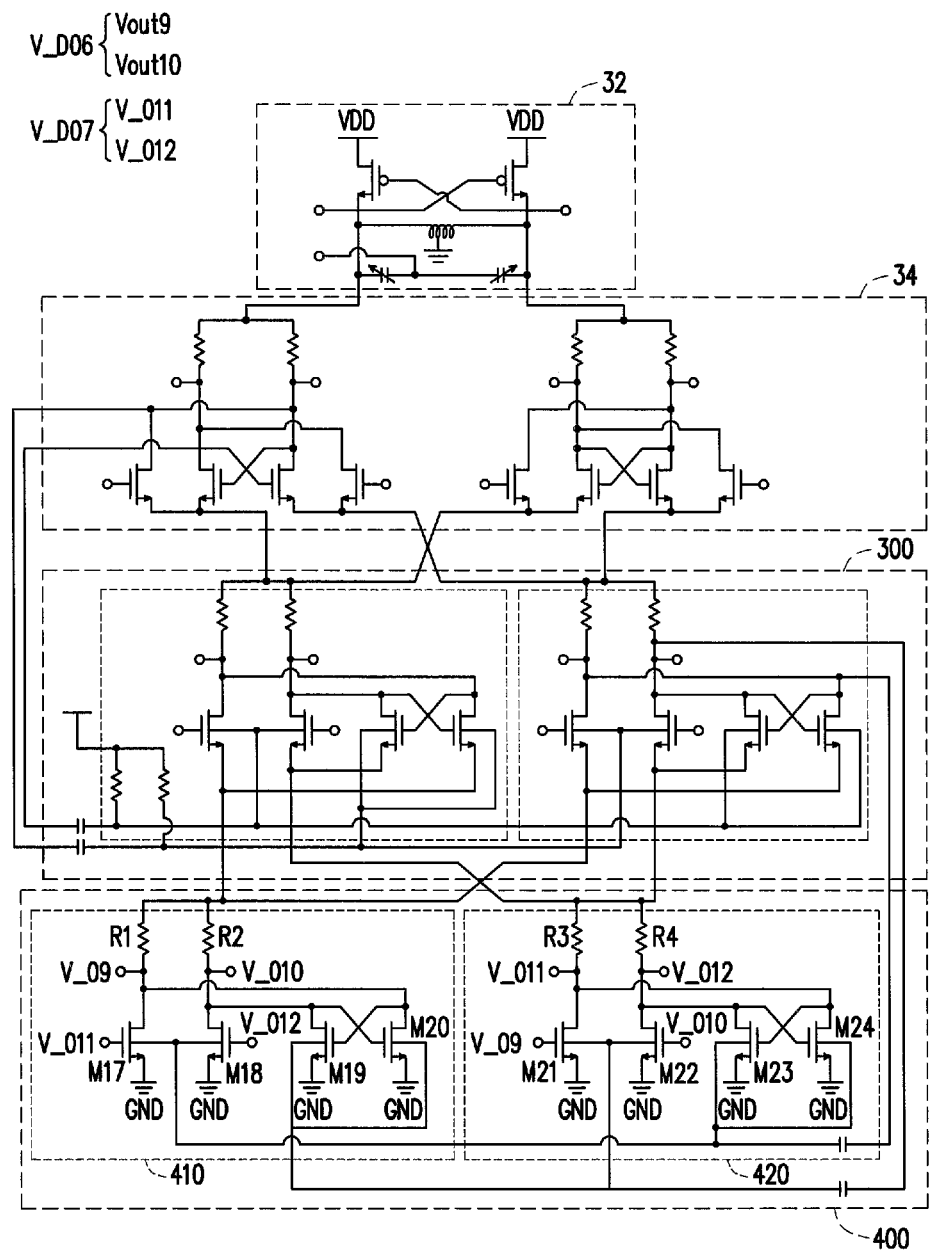
FIG. 4 is a circuit diagram of a VCO module according to another embodiment of the disclosure.

The circuit structure of a VCO module composed of multiple cascoded current reuse frequency dividers will be described in detail below. FIG. 4 is a circuit diagram of a VCO module according to another embodiment of the disclosure. Referring to FIG. 4, the present embodiment is similar to the embodiment illustrated in FIG. 3, and the difference between the two embodiments is that the VCO module 40 further includes a current reuse frequency divider 400 cascoded with the current reuse frequency divider 300. The current reuse frequency divider 400 divides the frequency of the differential oscillation signal V_D04 or V_D05 output by the current reuse frequency divider 300 and generates differential oscillation signals V_D06 and V_D07. Herein the frequencies of the differential oscillation signals V_D06 and V_D07 are respectively half of the frequencies of the differential oscillation signals V_D04 and V_D05. To simplify the drawing, the reference numerals of similar elements throughout the present embodiment and the embodiment illustrated in FIG. 3 can be referred to FIG. 3.

In the present embodiment, the current reuse frequency divider 400 includes a first latch circuit 410 and a second latch circuit 420. The first latch circuit 410 includes a transistor pair 412 composed of transistors M17 and M18 and a transistor pair 414 composed of transistors M19 and M20. The second latch circuit 420 includes a transistor pair 422 composed of transistors M21 and M22 and a transistor pair 424 composed of transistors M23 and M24. The body of each of the transistors M17-M24 also works with a bias voltage Vb (not shown).

Similar to the coupling pattern between the ILFD 34 and the current reuse frequency divider 300, to prevent signals from interfering each other between the current reuse frequency dividers 300 and 400, the transistors M1, M4, M5, and M8 in the current reuse frequency divider 300 are coupled to the transistors M17-M20 in the first latch circuit 410 via corresponding resistors R11 and R12, and the transistors M2, M3, M6, and M7 are coupled to the transistors M21-M24 in the second latch circuit 420 via corresponding resistors R13 and R14. In the present exemplary embodiment, it is assumed that the current reuse frequency divider 400 receives the differential oscillation signal V_D04 as its input signal. However, the disclosure is not limited thereto. Moreover, the structures of and the frequency division techniques adopted by the current reuse frequency dividers 400 and 300 are the same therefore will not be described herein.

Based on the VCO module 40 described in the present embodiment, those having ordinary knowledge in the art should be able to understand that a multi-stage current reuse frequency divider structure can be accomplished by simply cascoding a plurality of current reuse frequency dividers (100, 300, or 400) through the coupling technique between the current reuse frequency dividers 300 and 400 in the present embodiment.

Figure 5:
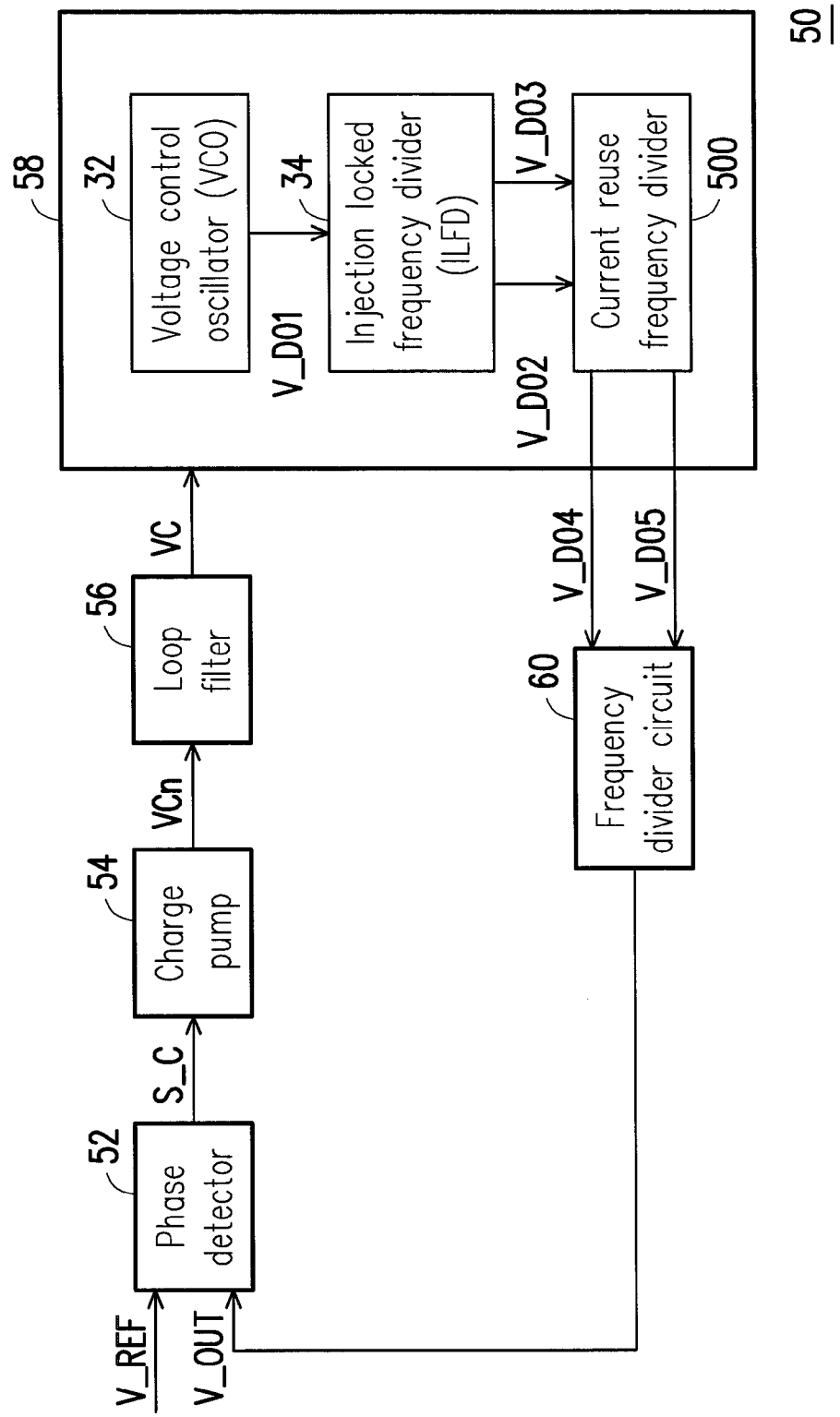
FIG. 5 is a diagram of a phase-locked loop (PLL) according to an embodiment of the disclosure.

FIG. 5 is a diagram of a phase-locked loop (PLL) according to an embodiment of the disclosure. In the present exemplary embodiment, the PLL 50 is only an exemplary application of the current reuse frequency divider and the VCO module described in foregoing embodiments but not for limiting the scope of the disclosure. Referring to FIG. 5, the PLL 50 includes a phase detector 52, a charge pump 54, a loop filter 56, a VCO module 58, and a frequency divider circuit 60. The phase detector 52 compares the phase of a reference signal V_REF with the phase of a differential output signal V_OUT and outputs a control signal S_C. The charge pump 54 is coupled to the phase detector 52. The charge pump 54 generates a control voltage VCn in response to the control signal S_C. The loop filter 56 is coupled to the charge pump 54. The loop filter 56 filters high-frequency noises out of the control voltage VCn and outputs the obtained control voltage VC to the VCO module 58. The VCO module 58 includes a VCO 32, an ILFD 34, and a current reuse frequency divider 500. The VCO 32 regulates the frequency of the differential oscillation signal V_D01 according to the control voltage VC. The ILFD 34 and the current reuse frequency divider 500 respectively generate the differential oscillation signals V_D02 and V_D03 of half frequencies and the differential oscillation signals V_D04 and V_D05 of quarter frequencies according to the received differential oscillation signals. The frequency divider circuit 60 is coupled to the VCO module 58 and the phase detector 52. The frequency divider circuit 60 divides the frequency of the differential oscillation signal V_D04 or V_D05 to generate a differential output signal V_OUT having the same frequency as the reference signal V_REF and sends the differential output signal V_OUT back to the phase detector 52.

In the present exemplary embodiment, the VCO module 58 may be the VCO module 30 or 40 in foregoing embodiment or a circuit composed of cascoded current reuse frequency dividers. Because part of the frequency division operation can be accomplished by the VCO module 58, the area taken by the high-power digital frequency divider circuit 60 in the entire PLL 50 can be effectively reduced, and accordingly the power consumption of the entire PLL 50 can be reduced.

As described above, exemplary embodiments of the disclosure provide a current reuse frequency divider, a frequency division method thereof, and a VCO module and a PLL using the same. In the current reuse frequency divider, the bodies of transistor pairs are served as signal input terminals so that the voltage headroom of the entire circuit is effectively reduced. In addition, in a current reuse VCO module provided by an exemplary embodiment of the disclosure, the power consumption of the entire circuit is reduced by using the same current path, and the application range of the circuit is widened because of the characteristics of the current reuse frequency divider.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A current reuse frequency divider, comprising:
a first latch circuit, comprising a first transistor pair and a second transistor pair, wherein the first latch circuit receives a first differential oscillation signal through bodies of the first transistor pair and the second transistor pair and divides a frequency of the first differential oscillation signal to generate a second differential oscillation signal; and
a second latch circuit, coupled to the first latch circuit, and comprising a third transistor pair and a fourth transistor pair, wherein the second latch circuit receives the first differential oscillation signal through bodies of the third transistor pair and the fourth transistor pair and divides the frequency of the first differential oscillation signal to generate a third differential oscillation signal,
wherein the first latch circuit further comprises:
a first transistor, having a first source/drain;
a second transistor, having a first source/drain, wherein the first transistor and the second transistor form the first transistor pair;
a third transistor, having a gate coupled to the first source/drain of the first transistor, a first source/drain coupled to the first source/drain of the second transistor, and a second source/drain coupled to a second source/drain of the second transistor; and
a fourth transistor, having a gate coupled to the first source/drain of the second transistor, a first source/drain coupled to the first source/drain of the first transistor, and a second source/drain coupled to a second source/drain of the first transistor, wherein the third transistor and the fourth transistor form the second transistor pair.

2. The current reuse frequency divider according to claim 1, wherein the first differential oscillation signal comprises a first oscillation signal and a second oscillation signal, the second differential oscillation signal comprises a third oscillation signal and a fourth oscillation signal,
wherein the first source/drain of the first transistor is configured for outputting the third oscillation signal, and
the first source/drain of the second transistor is configured for outputting the fourth oscillation signal, a body of the second transistor is coupled to a body of the first transistor and configured for receiving the first oscillation signal together, and
a body of the fourth transistor is coupled to a body of the third transistor and configured for receiving the second oscillation signal together.

3. The current reuse frequency divider according to claim 2, wherein the third differential oscillation signal comprises a fifth oscillation signal and a sixth oscillation signal, and the second latch circuit further comprises:
a fifth transistor, having a gate coupled to the first source/drain of the first transistor, a first source/drain coupled to a gate of the first transistor and for outputting the fifth oscillation signal, and a second source/drain coupled to the second source/drain of the first transistor and the second source/drain of the fourth transistor;
a sixth transistor, having a gate coupled to the first source/drain of the second transistor, a first source/drain coupled to a gate of the second transistor and for outputting the sixth oscillation signal, a second source/drain coupled to the second source/drain of the second transistor and the second source/drain of the third transistor, and a body coupled to a body of the fifth transistor for receiving the second oscillation signal together, wherein the fifth transistor and the sixth transistor form the third transistor pair;
a seventh transistor, having a gate coupled to the first source/drain of the fifth transistor, a first source/drain coupled to the first source/drain of the sixth transistor, and a second source/drain coupled to the second source/drain of the sixth transistor; and an eighth transistor, having a gate coupled to the first source/drain of the sixth transistor, a first source/drain coupled to the first source/drain of the fifth transistor, a second source/drain coupled to the second source/drain of the fifth transistor, and a body coupled to a body of the seventh transistor for receiving the first oscillation signal together, wherein the seventh transistor and the eighth transistor form the fourth transistor pair.

4. The current reuse frequency divider according to claim 3, wherein the second differential oscillation signal and the third differential oscillation signal are orthogonal to each other, and frequencies of the second differential oscillation signal and the third differential oscillation signal are respectively a half of the frequency of the first differential oscillation signal.

5. A voltage control oscillator (VCO) module, comprising:
a VCO, generating a first differential oscillation signal, wherein the VCO regulates a frequency of the first differential oscillation signal under the control of a control voltage;
an injection locked frequency divider (ILFD), coupled to the VCO, receiving the first differential oscillation signal, and dividing the frequency of the first differential oscillation signal to generate a second differential oscillation signal and a third differential oscillation signal; and
a first current reuse frequency divider, coupled to the ILFD, wherein the first current reuse frequency divider comprises:
a first latch circuit, comprising a first transistor pair and a second transistor pair, wherein the first latch circuit receives the second differential oscillation signal or the third differential oscillation signal through bodies of the first transistor pair and the second transistor pair and divides a frequency of the second differential oscillation signal or the third differential oscillation signal to generate a fourth differential oscillation signal; and
a second latch circuit, coupled to the first latch circuit, and comprising a third transistor pair and a fourth transistor pair, wherein the second latch circuit receives the second differential oscillation signal or the third differential oscillation signal through bodies of the third transistor pair and the fourth transistor pair and divides the frequency of the second differential oscillation signal or the third differential oscillation signal to generate a fifth differential oscillation signal.

6. The VCO module according to claim 5, wherein the VCO, the ILFD, and the first current reuse frequency divider are cascoded with each other to share a same current path.

7. The VCO module according to claim 5, wherein the second differential oscillation signal comprises a first oscillation signal and a second oscillation signal, the third differential oscillation signal comprises a third oscillation signal and a fourth oscillation signal, the fourth differential oscillation signal comprises a fifth oscillation signal and a sixth oscillation signal, and the first latch circuit further comprises:
a first transistor, having a first source/drain for outputting the fifth oscillation signal;
a second transistor, having a first source/drain for outputting the sixth oscillation signal, and a body coupled to a body of the first transistor for receiving the first oscillation signal or the third oscillation signal together, wherein the first transistor and the second transistor form the first transistor pair;

a third transistor, having a gate coupled to the first source/drain of the first transistor, a first source/drain coupled to the first source/drain of the second transistor, and a second source/drain coupled to a second source/drain of the second transistor; and
a fourth transistor, having a gate coupled to the first source/drain of the second transistor, a first source/drain coupled to the first source/drain of the first transistor, a second source/drain coupled to a second source/drain of the first transistor, and a body coupled to a body of the third transistor for receiving the second oscillation signal or the fourth oscillation signal together, wherein the third transistor and the fourth transistor form the second transistor pair.

8. The VCO module according to claim 7, wherein the fifth differential oscillation signal comprises a seventh oscillation signal and an eighth oscillation signal, and the second latch circuit further comprises:
a fifth transistor, having a gate coupled to the first source/drain of the first transistor, a first source/drain coupled to a gate of the first transistor and for outputting the seventh oscillation signal, and a second source/drain coupled to the second source/drain of the first transistor and the second source/drain of the fourth transistor;
a sixth transistor, having a gate coupled to the first source/drain of the second transistor, a first source/drain coupled to a gate of the second transistor and for outputting the eighth oscillation signal, a second source/drain coupled to the second source/drain of the second transistor and the second source/drain of the third transistor, and a body coupled to a body of the fifth transistor for receiving the second oscillation signal or the fourth oscillation signal together, wherein the fifth transistor and the sixth transistor form the third transistor pair;
a seventh transistor, having a gate coupled to the first source/drain of the fifth transistor, a first source/drain coupled to the first source/drain of the sixth transistor, and a second source/drain coupled to the second source/drain of the sixth transistor; and
an eighth transistor, having a gate coupled to the first source/drain of the sixth transistor, a first source/drain coupled to the first source/drain of the fifth transistor, a second source/drain coupled to the second source/drain of the fifth transistor, and a body coupled to a body of the seventh transistor for receiving the first oscillation signal or the third oscillation signal together, wherein the seventh transistor and the eighth transistor form the fourth transistor pair.

9. The VCO module according to claim 8, wherein the ILFD comprises:
a ninth transistor, having a first source/drain for outputting the second oscillation signal, and a second source/drain coupled to the first source/drain of the first transistor and the first source/drain of the second transistor;
a tenth transistor, having a first source/drain for outputting the first oscillation signal, and a second source/drain coupled to the second source/drain of the ninth transistor;
an eleventh transistor, having a gate coupled to the first source/drain of the tenth transistor, a first source/drain coupled to the first source/drain of the ninth transistor and a gate of the tenth transistor, and a second source/drain coupled to the first source/drain of the fifth transistor and the first source/drain of the sixth transistor;

a twelfth transistor, having a first source/drain coupled to the first source/drain of the tenth transistor, and a second source/drain coupled to the second source/drain of the eleventh transistor;

a thirteenth transistor, having a gate coupled to the first source/drain of the tenth transistor, a first source/drain coupled to a gate of the twelfth transistor and for outputting the fourth oscillation signal, and a second source/drain coupled to the first source/drain of the first transistor and the first source/drain of the second transistor;

a fourteenth transistor, having a first source/drain coupled to a gate of the ninth transistor and for outputting the third oscillation signal, and a second source/drain coupled to the second source/drain of the thirteenth transistor;

a fifteenth transistor, having a gate coupled to the first source/drain of the fourteenth transistor, a first source/drain coupled to the first source/drain of the thirteenth transistor and a gate of the fourteenth transistor, and a second source/drain coupled to the first source/drain of the fifth transistor and the first source/drain of the sixth transistor; and a sixteenth transistor, having a gate coupled to the first source/drain of the ninth transistor, a first source/drain coupled to the first source/drain of the fourteenth transistor and the gate of the fifteenth transistor, and a second source/drain coupled to the second source/drain of the fifteenth transistor.

10. The VCO module according to claim 9, wherein the second differential oscillation signal and the third differential oscillation signal are a set of quadrature phase oscillation signals, and the fourth differential oscillation signal and the fifth differential oscillation signal are another set of quadrature phase oscillation signals, wherein frequencies of the second differential oscillation signal and the third differential oscillation signal are respectively a half of the frequency of the first differential oscillation signal, and frequencies of the fourth differential oscillation signal and the fifth differential oscillation signal are respectively halves of the frequencies of the second differential oscillation signal and the third differential oscillation signal.

11. The VCO module according to claim 9 further comprising:

a second current reuse frequency divider, cascoded with the first current reuse frequency divider to share a same current path with the VCO, the ILFD, and the first current reuse frequency divider, wherein the second current reuse frequency divider comprises:

a third latch circuit, comprising a fifth transistor pair and a sixth transistor pair, wherein the third latch circuit receives the fourth differential oscillation signal or the fifth differential oscillation signal through bodies of the fifth transistor pair and the sixth transistor pair and divides a frequency of the fourth differential oscillation signal or the fifth differential oscillation signal to generate a sixth differential oscillation signal; and a fourth latch circuit, coupled to the first latch circuit, and comprising a seventh transistor pair and an eighth transistor pair, wherein the fourth latch circuit receives the fourth differential oscillation signal or the fifth differential oscillation signal through bodies of the seventh transistor pair and the eighth transistor pair and divides the frequency of the fourth differential oscillation signal or the fifth differential oscillation signal to generate a seventh differential oscillation signal.

12. The VCO module according to claim 11, wherein the sixth differential oscillation signal comprises a ninth oscillation signal and a tenth oscillation signal, and the third latch circuit further comprises;

a seventeenth transistor, having a first source/drain coupled to the second source/drain of the first transistor, the second source/drain of the fourth transistor, the second source/drain of the fifth transistor, and the second source/drain of the eighth transistor and for outputting the ninth oscillation signal;

an eighteenth transistor, having a first source/drain coupled to the second source/drain of the first transistor, the second source/drain of the fourth transistor, the second source/drain of the fifth transistor, and the second source/drain of the eighth transistor and for outputting the tenth oscillation signal, and a body coupled to a body of the seventeenth transistor for receiving the fifth oscillation signal or the seventh oscillation signal together, wherein the seventeenth transistor and the eighteenth transistor form the fifth transistor pair;

a nineteenth transistor, having a gate coupled to the first source/drain of the seventeenth transistor, a first source/drain coupled to the first source/drain of the eighteenth transistor, and a second source/drain coupled to a second source/drain of the eighteenth transistor; and a twentieth transistor, having a gate coupled to the first source/drain of the eighteenth transistor, a first source/drain coupled to the first source/drain of the seventeenth transistor, a second source/drain coupled to a second source/drain of the seventeenth transistor, and a body coupled to a body of the nineteenth transistor for receiving the sixth oscillation signal or the eighth oscillation signal together, wherein the nineteenth transistor and the twentieth transistor form the sixth transistor pair.

13. The VCO module according to claim 12, wherein the seventh differential oscillation signal comprises an eleventh oscillation signal and a twelfth oscillation signal, and the fourth latch circuit further comprises:

a twenty-first transistor, having a gate coupled to the first source/drain of the seventeenth transistor, a first source/drain coupled to a gate of the seventeenth transistor and for outputting the eleventh oscillation signal, and a second source/drain coupled to the second source/drain of the seventeenth transistor and the second source/drain of the twentieth transistor;

a twenty-second transistor, having a gate coupled to the first source/drain of the eighteenth transistor, a first source/drain coupled to a gate of the eighteenth transistor and for outputting the twelfth oscillation signal, a second source/drain coupled to the second source/drain of the eighteenth transistor and the second source/drain of the nineteenth transistor, and a body coupled to a body of the twenty-first transistor for receiving the sixth oscillation signal or the eighth oscillation signal together, wherein the twenty-first transistor and the twenty-second transistor form the seventh transistor pair;

a twenty-third transistor, having a gate coupled to the first source/drain of the twenty-first transistor, a first source/drain coupled to the first source/drain of the twenty-second transistor, and a second source/drain coupled to the second source/drain of the twenty-second transistor; and a twenty-fourth transistor, having a gate coupled to the first source/drain of the twenty-second transistor, a first source/drain coupled to the first source/drain of the twenty-first transistor, a second source/drain coupled to the second source/drain of the twenty-first transistor, and a body coupled to a body of the twenty-third transistor for receiving the fifth oscillation signal or the seventh oscillation signal together, wherein the twenty-third transistor and the twenty-fourth transistor form the eighth transistor pair.

14. The VCO module according to claim 13, wherein the sixth differential oscillation signal and the seventh differential oscillation signal are a set of quadrature phase oscillation signals, and frequencies of the sixth differential oscillation signal and the seventh differential oscillation signal are half of frequencies of the fourth differential oscillation signal and the fifth differential oscillation signal.

15. A phase-locked loop (PLL), comprising:
  a phase detector, comparing a phase of a reference signal with a phase of a differential output signal and outputting a control signal;
  a charge pump, coupled to the phase detector, and generating a control voltage in response to the control signal;
  a loop filter, coupled to the charge pump, and filtering high-frequency noises out of the control voltage;
  a voltage control oscillator (VCO) module, coupled to the loop filter, the VCO module comprising:
    a VCO, generating a first differential oscillation signal, wherein the VCO regulates a frequency of the first differential oscillation signal under the control of the control voltage;
    an injection locked frequency divider (ILFD), coupled to the VCO, receiving the first differential oscillation signal, and dividing the frequency of the first differential oscillation signal to generate a second differential oscillation signal and a third differential oscillation signal; and
    a first current reuse frequency divider, coupled to the ILFD, the ILFD comprising:
      a first latch circuit, comprising a first transistor pair and a second transistor pair, wherein the first latch circuit receives the second differential oscillation signal or the third differential oscillation signal through bodies of the first transistor pair and the second transistor pair and divides a frequency of the second differential oscillation signal or the third differential oscillation signal to generate a fourth differential oscillation signal; and
      a second latch circuit, coupled to the first latch circuit, and comprising a third transistor pair and a fourth transistor pair, wherein the second latch circuit receives the second differential oscillation signal or the third differential oscillation signal through bodies of the third transistor pair and the fourth transistor pair and divides the frequency of the second differential oscillation signal or the third differential oscillation signal to generate a fifth differential oscillation signal; and
  a frequency divider circuit, coupled to the VCO module and the phase detector, and dividing a frequency of the fourth differential oscillation signal or the fifth differential oscillation signal to generate the differential output signal.

16. The PLL according to claim 15, wherein the VCO, ILFD, and the first current reuse frequency divider are cascoded with each other to share a same current path.

17. The PLL according to claim 15, wherein the second differential oscillation signal comprises a first oscillation signal and a second oscillation signal, the third differential oscillation signal comprises a third oscillation signal and a fourth oscillation signal, and the fourth differential oscillation signal comprises a fifth oscillation signal and a sixth oscillation signal, wherein the first latch circuit further comprises:
  a first transistor, having a first source/drain for outputting the fifth oscillation signal;
  a second transistor, having a first source/drain for outputting the sixth oscillation signal, and a body coupled to a body of the first transistor for receiving the first oscillation signal or the third oscillation signal together, wherein the first transistor and the second transistor form the first transistor pair;
  a third transistor, having a gate coupled to the first source/drain of the first transistor, a first source/drain coupled to the first source/drain of the second transistor, and a second source/drain coupled to a second source/drain of the second transistor; and
  a fourth transistor, having a gate coupled to the first source/drain of the second transistor, a first source/drain coupled to the first source/drain of the first transistor, a second source/drain coupled to a second source/drain of the first transistor, and a body coupled to a body of the third transistor for receiving the second oscillation signal or the fourth oscillation signal together, wherein the third transistor and the fourth transistor form the second transistor pair.

18. The PLL according to claim 17, wherein the fifth differential oscillation signal comprises a seventh oscillation signal and an eighth oscillation signal, and the second latch circuit further comprises:
  a fifth transistor, having a gate coupled to the first source/drain of the first transistor, a first source/drain coupled to a gate of the first transistor and for outputting the seventh oscillation signal, and a second source/drain coupled to the second source/drain of the first transistor and the second source/drain of the fourth transistor;
  a sixth transistor, having a gate coupled to the first source/drain of the second transistor, a first source/drain coupled to a gate of the second transistor and for outputting the eighth oscillation signal, a second source/drain coupled to the second source/drain of the second transistor and the second source/drain of the third transistor, and a body coupled to a body of the fifth transistor for receiving the second oscillation signal or the fourth oscillation signal, wherein the fifth transistor and the sixth transistor form the third transistor pair;
  a seventh transistor, having a gate coupled to the first source/drain of the fifth transistor, a first source/drain coupled to the first source/drain of the sixth transistor, and a second source/drain coupled to the second source/drain of the sixth transistor; and
  an eighth transistor, having a gate coupled to the first source/drain of the sixth transistor, a first source/drain coupled to the first source/drain of the fifth transistor, a second source/drain coupled to the second source/drain of the fifth transistor, and a body coupled to a body of the seventh transistor for receiving the first oscillation signal or the third oscillation signal together, wherein the seventh transistor and the eighth transistor form the fourth transistor pair.

19. A frequency division method, adapted to a current reuse frequency divider comprising a plurality of transistor pairs, the frequency division method comprising:
  receiving a first differential oscillation signal through bodies of the transistor pairs; and
  dividing a frequency of the first differential oscillation signal to generate a second differential oscillation signal and a third differential oscillation signal, wherein the transistor pairs comprise a first transistor, a second transistor, a third transistor, a fourth transistor, a fifth transistor, a sixth transistor, a seventh transistor, and an eighth transistor, the first differential oscillation signal comprises a first oscillation signal and a second oscillation signal, and the step of receiving the first differential oscillation signal through the bodies of the transistor pairs comprises:

receiving the first oscillation signal through bodies of the first transistor, the second transistor, the seventh transistor, and the eighth transistor; and receiving the second oscillation signal through bodies of the third transistor, the fourth transistor, the fifth transistor, and the sixth transistor.

\* \* \* \* \*